(12) United States Patent
Liu

(10) Patent No.: US 11,310,025 B1
(45) Date of Patent: Apr. 19, 2022

(54) SIGNAL SYNCHRONIZING DEVICE AND DIGITAL SIGNAL OUTPUT DEVICE

(71) Applicant: Nuvoton Technology Corporation, Hsinchu (TW)

(72) Inventor: Tse-Yen Liu, Hsinchu (TW)

(73) Assignee: Nuvoton Technology Corporation, Hsinchu (TW)

(*) Notice: Subject to any disclaimer, the term of this patent is extended or adjusted under 35 U.S.C. 154(b) by 0 days.

(21) Appl. No.: 17/317,846

(22) Filed: May 11, 2021

(30) Foreign Application Priority Data

Jan. 13, 2021 (TW) .................................. 110101250

(51) Int. Cl.
*H04L 7/00* (2006.01)
*H03L 7/14* (2006.01)

(52) U.S. Cl.
CPC ............ *H04L 7/0008* (2013.01); *H03L 7/148* (2013.01)

(58) Field of Classification Search
CPC .............................. H04L 7/0008; H03L 7/148
See application file for complete search history.

(56) References Cited

U.S. PATENT DOCUMENTS

| | | | |
|---|---|---|---|
| 6,411,669 B1* | 6/2002 | Kim | H03L 7/193 377/47 |
| 6,608,743 B1* | 8/2003 | Suzuki | H03L 7/0812 361/100 |
| 7,332,940 B2 | 2/2008 | Watanabe | |
| 2010/0052739 A1* | 3/2010 | Shibata | H03K 23/667 327/158 |
| 2011/0199136 A1* | 8/2011 | Tsai | H03L 7/0896 327/536 |
| 2021/0050855 A1 | 2/2021 | Kim | |

FOREIGN PATENT DOCUMENTS

CN 1126318 10/2003
TW 480487 3/2002

* cited by examiner

*Primary Examiner* — Jaison Joseph
(74) *Attorney, Agent, or Firm* — JCIPRNET

(57) ABSTRACT

The disclosure provides a signal synchronizing device and a digital signal output device. A digital circuit counts a first frequency signal to generate a count value, and generates an output voltage according to the count value. An analog circuit generates a feedback signal according to the output voltage. A synchronization circuit samples the feedback signal according to a second frequency signal to generate a synchronization signal. A control circuit generates a voltage control signal according to the second frequency signal and the synchronization signal to control the digital circuit to stop counting the first frequency signal, and a frequency of the first frequency signal is lower than a frequency of the second frequency signal.

10 Claims, 5 Drawing Sheets

SIGNAL SYNCHRONIZING DEVICE AND DIGITAL SIGNAL OUTPUT DEVICE

CROSS-REFERENCE TO RELATED APPLICATION

This application claims the priority benefit of Taiwan application serial no. 110101250, filed on Jan. 13, 2021. The entirety of the above-mentioned patent application is hereby incorporated by reference herein and made a part of this specification.

BACKGROUND

Technical Field

The disclosure relates to an electronic device, and in particular to a signal synchronizing device and a digital signal output device.

Description of Related Art

As integrated circuits have become more complicated, in addition to a chip having an integrated design of an analog circuit and a digital circuit, there are multiple operating areas with different frequencies inside the digital circuit. In order to prevent a metastable digital signal to be generated due to a digital signal being transmitted between different frequency domains, when the digital signals cross frequency domains, a synchronization circuit is relied on to avoid the generation of a metastable phenomenon.

In the conventional technology, a commonly used synchronization circuit is designed to avoid the generation of the metastable phenomenon by a cascaded two stage flip-flop (D flip-flop). When a metastable phenomenon occurs to a first stage flip-flop, a second stage flip-flop may correct the metastable signal to avoid an operational error in the digital circuit caused by the metastable phenomenon. However, when the digital signal passes through the two stage flip-flop, two periods of signal delay occur, so the synchronization circuit with the two stage flip-flop is not suitable for an application that requires real-time control.

SUMMARY

The disclosure provides a signal synchronizing device and a digital signal output device, which avoid the generation of a metastable phenomenon and meet real-time control requirements when an analog signal is synchronized to a frequency domain of a digital signal.

A signal synchronizing device of the disclosure includes a synchronization circuit and a control circuit. The signal synchronizing device is coupled to a digital circuit that generates an output voltage according to a first frequency signal, and is coupled to an analog circuit that generates a feedback signal according to the output voltage. The synchronization circuit is coupled to the analog circuit, and samples the feedback signal according to a second frequency signal to generate a synchronization signal. The control circuit is coupled to the digital circuit and the synchronization circuit, and generates a voltage control signal according to the second frequency signal and the synchronization signal to control the digital circuit to generate the output voltage. The control circuit includes a first AND gate and multiple flip-flops. An output terminal of the first AND gate is coupled to the digital circuit. The flip-flops are cascaded with each other and connected between an output terminal of the synchronization circuit and an input terminal of the first AND gate, and sequentially transmit the synchronization signal is in response to the second frequency signal. The input terminal of the first AND gate is coupled to an output terminal of each of the flip-flops and the output terminal of the synchronization circuit, and the voltage control signal is generated according to an output signal of each of the flip-flops and the synchronization signal. A frequency of the first frequency signal is lower than a frequency of the second frequency signal, and the voltage control signal is synchronized with the feedback signal.

In an embodiment of the disclosure, the above-mentioned signal synchronizing device further includes a frequency adjustment circuit, which is coupled to the digital circuit, and adjusts the frequency of the second frequency signal to generate the first frequency signal.

In an embodiment of the disclosure, the number of flip-flops as mentioned above satisfies the following formula:

$$4 \leq N + 2 \leq \log_2\left(\frac{FC2}{FC1}\right)$$

In the formula, N is the number of flip-flops, FC1 is the frequency of the first frequency signal, and FC2 is the frequency of the second frequency signal.

The disclosure also provides a digital signal output device including a digital circuit, an analog circuit, and the above-mentioned signal synchronizing device. The digital circuit generates the output voltage according to the first frequency signal, and the analog circuit is coupled to the digital circuit, and generates the feedback signal according to the output voltage.

In an embodiment of the disclosure, the above-mentioned digital circuit includes a counter, which is coupled to the output terminal of the first AND gate, counts the first frequency signal, to generate a count value, and is controlled by the voltage control signal to stop counting the first frequency signal. A regulator is coupled to the counter and the analog circuit, and generates the output voltage according to the count value.

In an embodiment of the disclosure, the above-mentioned digital signal output device further includes an inverter and a second AND gate. An input terminal and an output terminal of the inverter are respectively coupled to the output terminal of the first AND gate and an input terminal of the counter, and the counter stops counting the first frequency signal according to an output signal of the inverter. An input terminal of the second AND gate is coupled to the output terminal of the inverter and receives an enable signal. An output terminal of the second AND gate is coupled to the input terminal of the counter. The second AND gate controls the counter to stop counting the first frequency signal according to the enable signal and the output signal of the inverter.

In an embodiment of the disclosure, the aforementioned synchronization circuit includes a first synchronization flip flop and a second synchronization flip flop. The second synchronization flip flop is cascaded with the first synchronization flip flop between the analog circuit and the control circuit. The first synchronization flip flop and the second synchronization flip flop sequentially transmit the feedback signal in response to the second frequency signal to output the synchronization signal from an output terminal of the second synchronization flip flop.

In an embodiment of the disclosure, the above-mentioned analog circuit is a comparator. An input terminal of the comparator is coupled to an output terminal of the digital circuit and a reference voltage. An output terminal of the comparator is coupled to the synchronization circuit, and the comparator compares the output voltage with the reference voltage to generate the feedback signal.

In an embodiment of the disclosure, the above-mentioned digital signal output device further includes a first switching circuit, which is coupled to an output terminal of the digital circuit, an input terminal of the comparator, and an output terminal of a signal generating circuit, and is controlled by a first switching signal to connect the input terminal of the comparator to the output terminal of the digital circuit or the output terminal of the signal generating circuit.

In an embodiment of the disclosure, the above-mentioned digital signal output device further includes a latch circuit and a second switching circuit. The latch circuit latches an output signal of the comparator. The second switching circuit is coupled to an output terminal of the analog circuit, the synchronization circuit, and the latch circuit, and is controlled by a second switching signal to connect an output terminal of the comparator to an input terminal of the synchronization circuit or an input terminal of the latch circuit.

According to the above, in the embodiments of the disclosure, the frequency of the frequency signal on which the digital circuit is based to generate the output voltage is lower than the frequency of the frequency signal input to the synchronization circuit and the control circuit. Accordingly, the control circuit respond to changes of the feedback signal output by the analog circuit in real time to control the output voltage of the digital circuit. The synchronization circuit design avoids the generation of a metastable phenomenon, and the control circuit corrects the signal delay that might be generated by the synchronization circuit, thereby meeting the real-time control requirements when the analog signal is synchronized to the frequency domain of the digital signal. In addition, by coupling the output terminals of the flip-flops cascaded in the control circuit to the input terminal of the AND gate, and controlling the output voltage of the digital circuit according to the voltage control signal output by the AND gate, the abnormality occurred to the digital signal output device caused by uttering of the feedback signal provided by the analog circuit is avoided.

To further describe the features and advantages of the disclosure, embodiments accompanied with drawings are described below in details.

DESCRIPTION OF THE EMBODIMENTS

Figure 1:
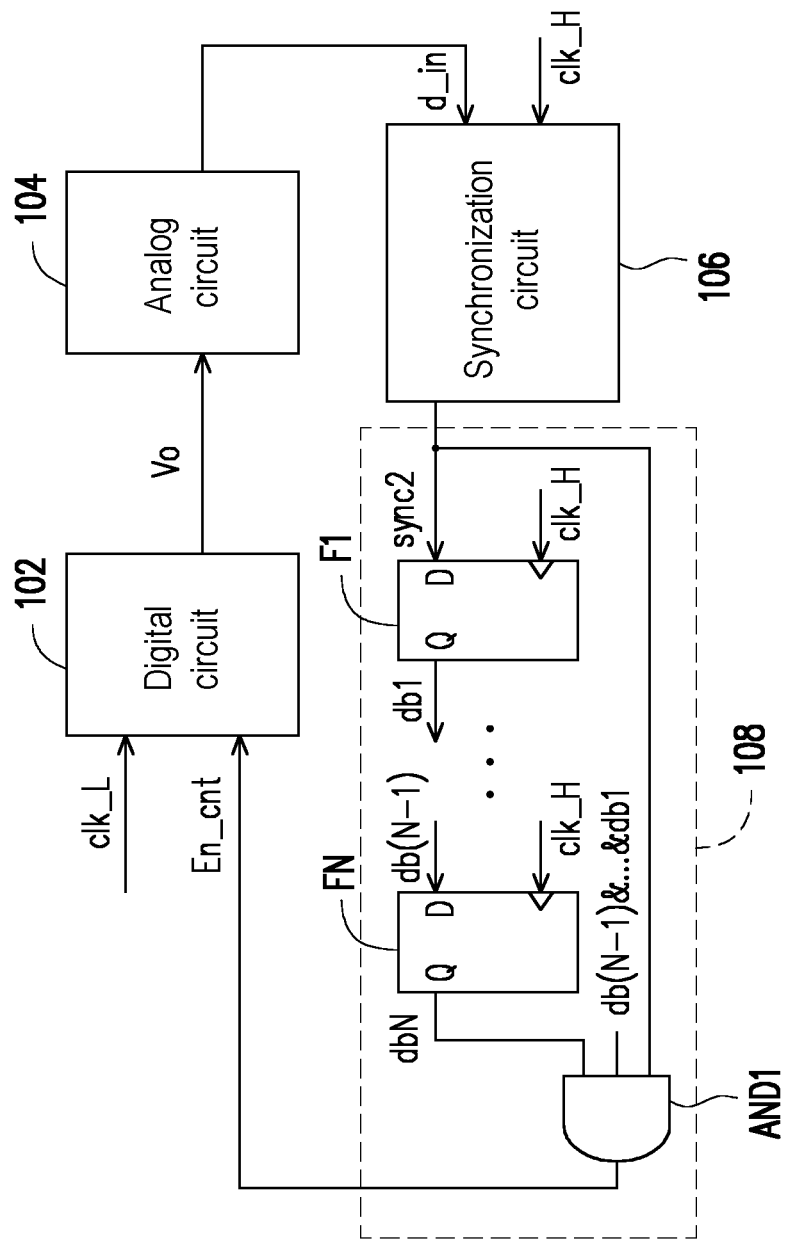
FIG. 1 is a schematic diagram of a digital signal output device according to an embodiment of the disclosure.

The term "coupled" used in this specification (including in the claims) may refer to any direct or indirect connection method. For example, "the first device is coupled to the second device" may be interpreted as "the first device is directly connected to the second device" or "the first device is indirectly connected to the second device through other devices or connection methods". In addition, wherever appropriate in the drawings and the embodiments, elements/devices/steps with the same reference numeral represent the same or similar parts. An element/device/step can be related to for descriptions of elements/devices/steps with the same reference numeral or the same name in other embodiments.

The following provides multiple embodiments to describe the disclosure in detail, but the disclosure is not limited to the provided embodiments, and the provided embodiments may be appropriately combined. In the following embodiments, same or similar element symbols refer to same or similar components or signals.

FIG. 1 is a schematic diagram of a digital signal output device according to an embodiment of the disclosure. Referring to FIG. 1, the digital signal output device may include a digital circuit 102, an analog circuit 104, and a signal synchronizing device including a synchronization circuit 106 and a control circuit 108. The digital circuit 102 is coupled to the analog circuit 104 and the control circuit 108. The synchronization circuit 106 is coupled to the analog circuit 104 and the control circuit 108. The digital circuit 102 may count a frequency signal clk_L to generate a count value, and generate an output voltage Vo corresponding to the count value according to the count value. The analog circuit 104 may generate a feedback signal d_in to the synchronization circuit 106 according to the output voltage Vo, and the synchronization circuit 106 may sample the feedback signal d_in according to a frequency signal clk_H to generate a synchronization signal sync2. The frequency of the frequency signal clk_L is lower than the frequency of the frequency signal clk_H. For example, the control circuit 108 may generate a voltage control signal En_cnt according to the synchronization signal sync2 and the frequency signal clk_H to the digital circuit 102 (the voltage control signal En_cnt is synchronized with the feedback signal d_in) so as to control the digital circuit 102 to stop counting the frequency signal clk_L, thereby correcting the output voltage Vo.

Specifically, the control circuit 108, as shown in FIG. 1, may include an AND gate AND1 and a plurality of cascaded flip-flops F1 to FN. A data input terminal of the flip-flop F1 is coupled to the synchronization circuit 106. A data output terminal of the flip-flop F1 is coupled to the next flip-flop F2. By analogy, a data output terminal of the N−1 stage flip-flop FN−1 is coupled to a data input terminal of the N stage flip-flop FN. The output terminal of each of the flip-flops F1 to FN is coupled to an input terminal of the AND gate AND1, and the frequency input terminal of each of the flip-flops F1 to FN receives the frequency signal clk_H. In response to the frequency signal clk_H, the flip-flops F1 to FN sequentially transmit the synchronization signal sync2. The input terminal of the AND gate AND1 is coupled to the output terminals of the flip-flops F1 to FN and an output terminal of the synchronization circuit 106. An output terminal of the AND gate AND1 is coupled to the digital circuit 102.

In this way, by coupling the output terminal of the synchronization circuit 106 and the output terminals of the flip-flops F1 to FN to the input terminal of the AND gate AND1, the control circuit 108 may be ensured to control the digital circuit 102 to stop counting the frequency signal clk_L only when the feedback signal d_in provided by the analog circuit 104 does not jitter, that is, when sample signals db1 to dbN and the synchronization signal sync2 output by the flip-flops F1 to FN are all at a same logical level, so as to avoid malfunction. In addition, since the frequency of the frequency signal clk_L is set to be lower than the frequency of the frequency signal clk_H, the control circuit 108 may react in real time to changes of the feedback signal d_in output by the analog circuit 104 and control the output voltage of the digital circuit 102. Accordingly, the synchronization circuit may be used to avoid the generation of a metastable phenomenon, and the control circuit may be used to correct a signal delay that may be generated by the synchronization circuit. Therefore, a real-time control requirement during the analog signal being synchronized to the frequency domain of the digital signal may be met.

Specifically, the number N of flip-flops in the control circuit 108 may satisfy the following formula, so as to ensure that the control circuit 108 may avoid malfunction and meet the real-time control requirement during the analog signal being synchronized to the frequency domain of the digital signal.

$$4 \le N + 2 \le \log_2\left(\frac{FC2}{FC1}\right) \quad (1)$$

In formula (1), FC1 is the frequency of the frequency signal clk_L, and FC2 is the frequency of the frequency signal clk_H.

Figure 2:
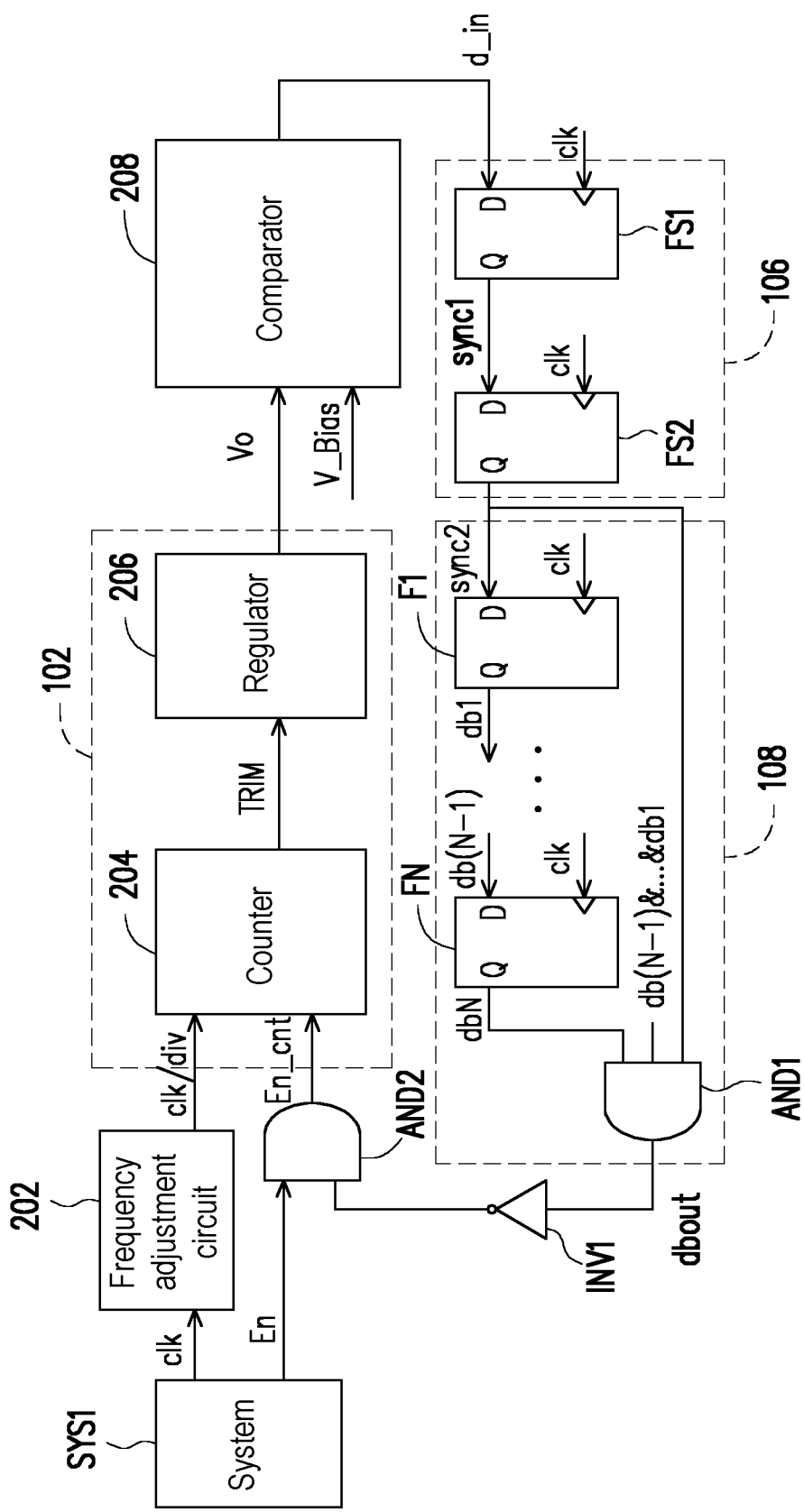
FIG. 2 is a schematic diagram of a digital signal output device according to another embodiment of the disclosure.

FIG. 2 is a schematic diagram of a digital signal output device according to another embodiment of the disclosure. In this embodiment, the digital signal output device may further include a frequency adjustment circuit 202, an AND gate AND2, and an inverter INV1. The digital circuit 102 may include a counter 204 and a regulator 206. The synchronization circuit 106 may include cascaded synchronization flip flops FS1 and FS2. The frequency adjustment circuit 202 is coupled to the counter 204 and a system SYS1. The system SYS1 may be, for example, a central processing unit, but is not limited thereto. An input terminal of the AND gate AND2 is coupled to the system SYS1 and an output terminal of the inverter INV1. An output terminal of the AND gate AND2 is coupled to the counter 204. An input terminal of the inverter INV1 is coupled to the output terminal of the AND gate AND1. In addition, in this embodiment, the analog circuit 104 is implemented by using a comparator 208.

In this embodiment, a frequency signal clk is used as the frequency signal clk_H. The frequency of the frequency signal clk may be adjusted by the frequency adjustment circuit 202. The frequency adjustment circuit 202 may be implemented by, for example, a frequency dividing circuit, and frequency dividing circuit divides the frequency signal clk. After the frequency division, a frequency signal clk/div is obtained and used as the frequency signal clk_L. In some embodiments, the frequency adjustment circuit 202 may be implemented with a frequency multiplying circuit, too, and is not limited to this embodiment. The counter 204 may count the frequency signal clk, and output a trim signal TRIM to the regulator 206 according to a count value obtained by the count frequency signal clk, so as to control the regulator 206 to adjust the output voltage Vo. The comparator 208 may compare the output voltage Vo with a reference voltage V_Bias, and generate the feedback signal d_in to a data input terminal of the synchronization flip flop FS1. The synchronization flip flops FS1 and FS2 may transmit the feedback signal d_in in response to the frequency signal clk, and respectively generate synchronization signals sync1 and sync2 at output terminals of the synchronization flip flops FS1 and FS2.

Figure 3:
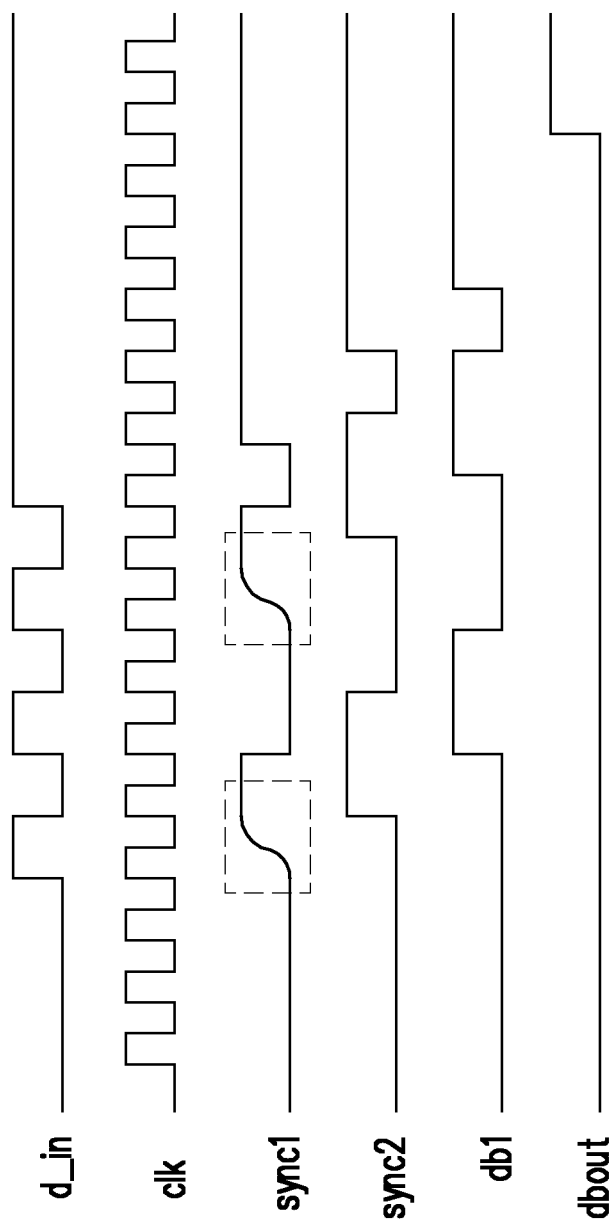
FIG. 3 is a schematic diagram of a signal waveform of a digital signal output device according to an embodiment of the disclosure.

As shown in the signal waveform diagram in FIG. 3, the synchronization flip flops FS1 and FS2 of the synchronization circuit 106 are used to sample the feedback signal d_in. A metastable phenomenon (as shown by the dotted area) occurring to the synchronization signal sync1 output by the synchronization flip flop FS1 may be eliminated after being sampled again by the synchronization flip flop FS2. In addition, due to a signal delay caused by the flip-flops F1 to FN transmitting the synchronization signal sync2, a sample signal dbN output by the flip-flop FN is three signal periods later than the sample signal db1 (assuming that N is equal to 3 in the embodiment in FIG. 3). In a situation where the feedback signal d_in does not jitter, an output signal dbout of the AND gate AND1 may be converted to a high logical level according to the sample signals db1 to dbN and the synchronization signal sync2. In a situation where the feedback signal d_in jitters, the time point when the output signal dbout of the AND gate AND1 is converted to a high logical level is further delayed, and the output signal dbout of the AND gate AND1 is converted to a high logical level when the sample signals db1 to dbN and the synchronization signal sync2 are both at a high logical level. Accordingly, a case where the output signal dbout of the AND gate AND1 causing malfunction of the digital signal output device may be prevented.

The output signal dbout of the AND gate AND1 may be converted into the voltage control signal En_cnt through the inverter INV1 and the AND gate AND2 to control the counting action of the counter 204. For example, in a situation where the digital signal output device is applied to a voltage generator, when a change occurs to the feedback signal d_in output by the comparator 208 (for example, when changing from a high logical level to a low logical level or changing from a low logical level to a high logical level), the voltage control signal En_cnt is generated through the synchronization circuit 106, the control circuit 108, the inverter INV1 and the AND gate AND2, so as to control the counter 204 to stop counting, thereby correcting the output voltage Vo of the regulator 206.

In some embodiments, the reference voltage V_Bias may be the internal reference voltage of a chip applying the digital signal output device. That is, in order to allow the output voltage Vo to meet the requirements of a load terminal, the system SYS1 only needs to provide the frequency signal clk to the digital signal output device to correct the output voltage Vo. Therefore, there is no need to provide a reference voltage from an external device, and an extra circuit area reserved for correcting a voltage deviation may be reduced. In addition, in other embodiments, the frequency signal clk and the reference voltage V_Bias may be provided externally, too. For example, when performing a mass production testing of the digital signal output device, the frequency signal clk and the reference voltage V_Bias provided externally may be provided to a plurality of digital signal output devices at the same time to correct the output voltage Vo, thereby improving detection efficiency, without the need to detect the output voltage when the output voltage is being corrected as in the conventional technology. In the conventional technology, only one chip may be detected at a time.

In the embodiment of FIG. 3, the voltage control signal En_cnt may be generate according to an enable signal En provided by the system SYS1. That is, whether to allow the AND gate AND2 to output the voltage control signal En_cnt may be determined by the enable signal En provided by the system SYS1. For example, when the enable signal En provided by the system SYS1 is at a low logical level, regardless of whether the output signal dbout of the AND gate AND1 is at a high logical level, the voltage control signal En_cnt cannot be converted to a high logical level to control the counting action (for example, allow the counter to stop counting or to start counting) of the counter 204.

It is worth noting that in some embodiments, the digital signal output device may selectively not include the AND gate AND2 and the inverter INV1, or not include one of the AND gate AND2 and the inverter INV1. In a situation where the digital signal output device does not include the AND gate AND2, the output terminal of the inverter INV1 is coupled to the counter 204, and at this time, the voltage control signal En_cnt is provided by the inverter INV1. In a situation where the inverter INV1 is not included, the input terminal of the AND gate AND2 is coupled to the output terminal of the AND gate AND1 and the system SYS1, and the AND gate AND2 is changed to generate the voltage control signal En_cnt according to the enable signal En and the output signal dbout of the AND gate AND1.

Figure 4:
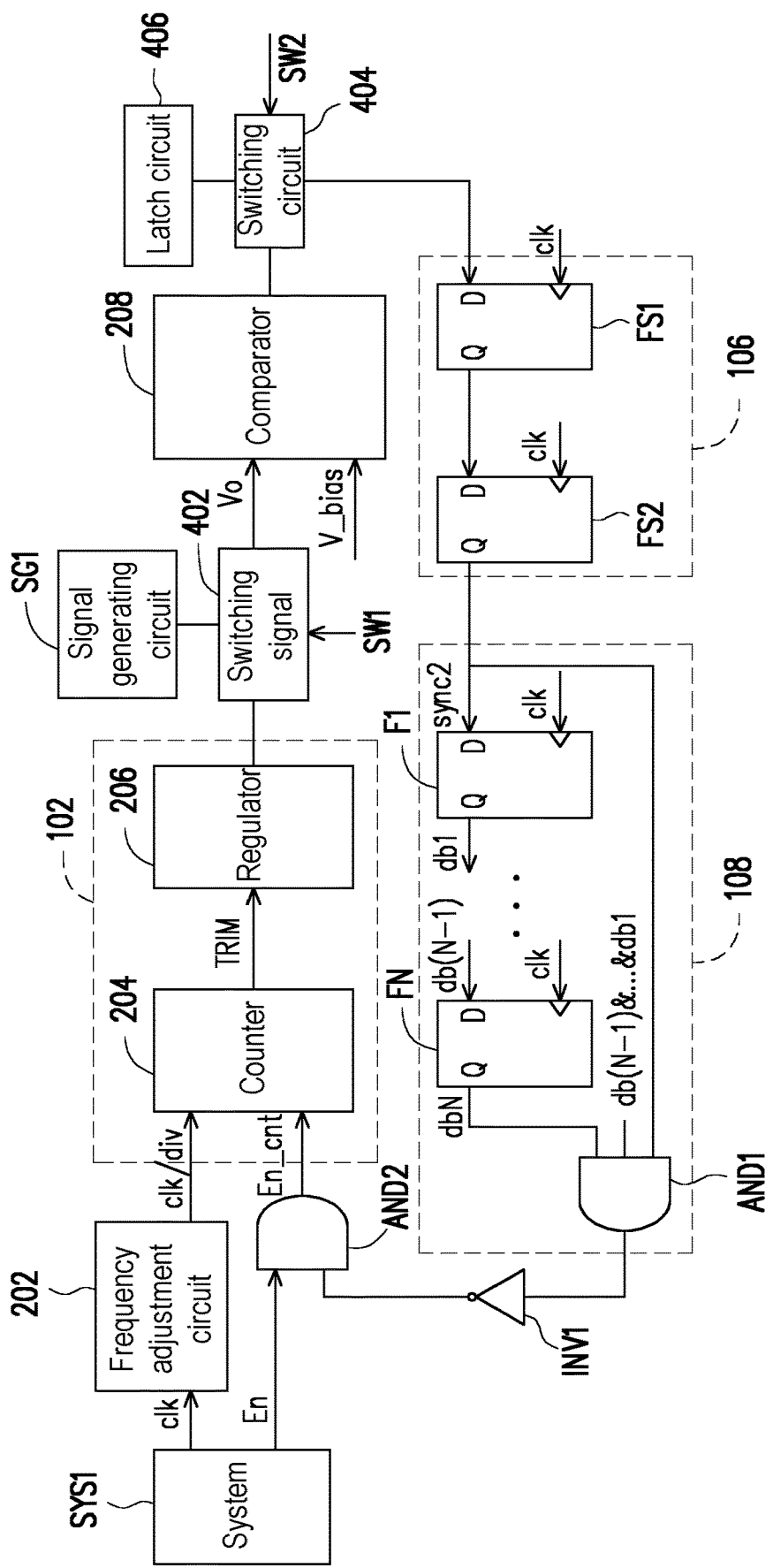
FIG. 4 is a schematic diagram of a digital signal output device according to another embodiment of the disclosure.
Figure 5:
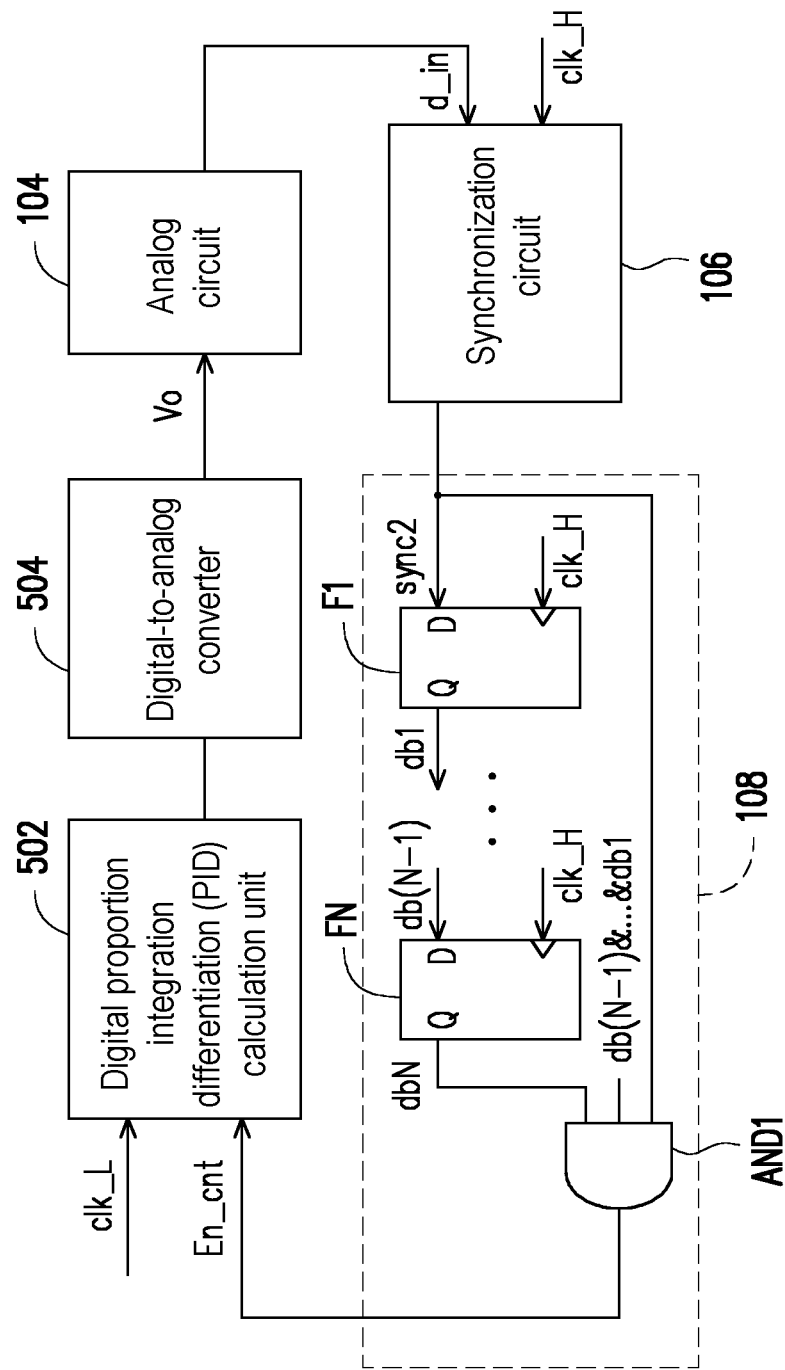
FIG. 5 is a schematic diagram of a digital signal output device according to another embodiment of the disclosure.

FIG. 4 is a schematic diagram of a digital signal output device according to another embodiment of the disclosure. In this embodiment, the digital signal output device further includes switching circuits 402 and 404 and a latch circuit 406. The switching circuit 402 is coupled to an output terminal of the regulator 206, an output terminal of a signal generating circuit SG1, and an input terminal of the comparator 208. The switching circuit 404 is coupled to an output terminal of the comparator 208, the latch circuit 406, and the data input terminal of the synchronization flip flop FS1.

The switching circuit 402 may be controlled by the switching signal SW1 to connect the input terminal of the comparator 208 to the output terminal of the regulator 206 or the output terminal of the signal generating circuit SG1. The signal generating circuit SG1 may be, for example, other application circuits inside a chip applying the digital signal output device. Through the switching operation of the switching circuit 402, the comparator 208 of the digital signal output device may be shared with the signal generating circuit SG1, and the production cost of the chip may be thus reduced. In addition, the switching circuit 404 may be controlled by a switching signal SW2 to connect the output terminal of the comparator 208 to the data input terminal of the synchronization flip flop FS1 or an input terminal of the latch circuit 406. For example, when the digital signal output device needs to perform a correction to the output voltage Vo, the switching circuit 402 may be controlled by the switching signal SW1 to connect the input terminal of the comparator 208 to the output terminal of the regulator 206, and the switching circuit 404 may be controlled by the switching signal SW2 to connect the output terminal of the comparator 208 to the data input terminal of the synchronization flip flop FS1. Since the latch circuit 406 may latch an output result when the comparator 208 is connected to the signal generating circuit SG1, even when the input terminal of the comparator 208 is switched to be connected to the output terminal of the regulator 206, and the output terminal of the comparator 208 is connected to the data input terminal of synchronization flip flop FS1, the operation of other circuits using an output signal of the comparator 208 when the comparator 208 is connected to the signal generating circuit SG1 is not affected.

Although various embodiments have been described with reference to the above drawings, methods of other embodiments are still feasible. For example, the digital circuit 102 of the digital signal output device of the disclosure may be a digital proportion integration differentiation (PID) calculation unit 502, too. The digital PID calculation unit 502 is coupled to a digital-to-analog converter 504 and the control circuit 108. The digital-to-analog converter 504 is coupled to the analog circuit 104. The synchronization circuit 106 is coupled to the analog circuit 104 and the control circuit 108. The analog circuit 104 is implemented by using the comparator 208. The digital PID calculation unit 502, the digital-to-analog converter 504, the comparator 208, the synchronization circuit 106, and the control circuit 108 form a closed loop circuit. The digital PID calculation unit 502 may receive the external frequency signal clk_L and then generate a control signal through a P control (proportion control), a PI control (proportion integration control), a PD control (proportional derivative control) or a PID control (proportional integral derivative control). The control signal is converted into an analog signal of the output voltage Vo by the digital-to-analog converter 504. The comparator 208 may compare the output voltage Vo with the reference voltage V_Bias, and generate the feedback signal d_in to a data input terminal of the synchronization circuit 106. The synchronization circuit 106 may sample the feedback signal d_in according to the frequency signal clk_H to generate the synchronization signal sync2. The control circuit 108 may generate the voltage control signal En_cnt to the digital PID calculation unit 502 according to the synchronization signal sync2 and the frequency signal clk_H. The digital PID calculation unit 502 corrects the counting of the frequency signal clk_L according to the voltage control signal En_cnt, thereby correcting the output voltage Vo. In this example, the digital PID calculation unit 502 is used to adjust the output voltage of a power supply, but the digital PID calculation unit 502 may also receive a digital voltage value or a digital current value to be used in other digital feedback control systems, and details thereof are omitted herein.

In summary, in the embodiments of the disclosure, the frequency of the frequency signal on which the digital circuit is based to generate the output voltage is lower than the frequency of the frequency signal input to the synchronization circuit and the control circuit. Accordingly, the control circuit may respond to changes of the feedback signal output by the analog circuit in real time to control the output voltage of the digital circuit. As a result, the generation of a metastable phenomenon is avoided, and the real-time control requirements when the analog signal is synchronized to the frequency domain of the digital signal are met. In addition, by coupling the output terminals of the flip-flops cascaded in the control circuit to the input terminal of the AND gate, and controlling the output voltage of the digital circuit according to the voltage control signal output by the AND gate, the abnormality occurred to the digital signal output device caused by jittering of the feedback signal provided by the analog circuit is avoided. In some embodiments, a latch circuit and two switching circuits may further be used so that the analog circuit may be shared with other circuits, thereby reducing the cost of chip production without affecting the normal operation of the chip.

Although the disclosure has been disclosed in the above by way of embodiments, the embodiments are not intended to limit the disclosure. Those with ordinary knowledge in the technical field can make various changes and modifications without departing from the spirit and scope of the disclosure. Therefore, the scope of protection of the disclosure is defined by the scope of the appended claims.

What is claimed is:

1. A signal synchronizing device, coupled to a digital circuit that generates an output voltage according to a first frequency signal, coupled to an analog circuit that generates a feedback signal according to the output voltage, comprising:
    a synchronization circuit, coupled to the analog circuit, sampling the feedback signal according to a second frequency to generate a synchronization signal; and
    a control circuit, coupled to the digital circuit and the synchronization circuit, generating a voltage control signal according to the second frequency signal and the synchronization signal to control the digital circuit to generate the output voltage, wherein the control circuit comprises:
    a first AND gate, wherein an output terminal of the first AND gate is coupled to the digital circuit; and
    a plurality of flip-flops, cascaded with each other and connected between an output terminal of the synchronization circuit and an input terminal of the first AND gate, sequentially transmitting the synchronization signal in response to the second frequency signal, wherein the input terminal of the first AND gate is coupled to an output terminal of each of the flip-flops and the output terminal of the synchronization circuit, and the voltage control signal is generated according to an output signal of each of the flip-flops and the synchronization signal, wherein a frequency of the first frequency signal is lower than a frequency of the second frequency signal, and the voltage control signal is synchronized with the feedback signal.

2. The signal synchronizing device according to claim 1, further comprising:
    a frequency adjustment circuit, coupled to the digital circuit, adjusting the frequency of the second frequency signal to generate the first frequency signal.

3. The signal synchronizing device according to claim 1, wherein the number of flip-flops satisfies the following formula:

$$4 \le N + 2 \le \log_2\left(\frac{FC2}{FC1}\right)$$

wherein N is the number of flip-flops, FC1 is the frequency of the first frequency signal, and FC2 is the frequency of the second frequency signal.

4. The signal synchronizing device according to claim 1, wherein the synchronization circuit comprises:
    a first synchronization flip flop; and
    a second synchronization flip flop, cascaded with the first synchronization flip flop between the analog circuit and the control circuit, wherein the first synchronization flip flop and the second synchronization flip flop sequentially transmit the feedback signal in response to the second frequency signal to output the synchronization signal from an output terminal of the second synchronization flip flop.

5. A digital signal output device, comprising:
    a digital circuit, an analog circuit, and the signal synchronizing device according to claim 1, wherein the digital circuit generates the output voltage according to the first frequency signal, the analog circuit is coupled to the digital circuit, and generates the feedback signal according to the output voltage.

6. The digital signal output device according to claim 5, wherein the digital circuit comprises:
    a counter, coupled to the output terminal of the first AND gate, counting the first frequency signal to generate a count value, controlled by the voltage control signal to stop counting the first frequency signal; and
    a regulator, coupled to the counter and the analog circuit, generating the output voltage according to the count value.

7. The digital signal output device according to claim 6, further comprising:
    an inverter, wherein an input terminal and an output terminal of the inverter are respectively coupled to the output terminal of the first AND gate and an input terminal of the counter, and the counter stops counting the first frequency signal according to an output signal of the inverter; and
    a second AND gate, wherein an input terminal of the second AND gate is coupled to the output terminal of the inverter and receives an enable signal, an output terminal of the second AND gate is coupled to the input terminal of the counter, and the second AND gate controls the counter to stop counting the first frequency signal according to the enable signal and the output signal of the inverter.

8. The digital signal output device according to claim 5, wherein the analog circuit is a comparator, an input terminal of the comparator is coupled to an output terminal of the digital circuit and a reference voltage, an output terminal of the comparator is coupled to the synchronization circuit, and the comparator compares the output voltage with the reference voltage to generate the feedback signal.

9. The digital signal output device according to claim 5, further comprising:
    a first switching circuit, coupled to the output terminal of the digital circuit, the input terminal of the analog circuit, and an output terminal of a signal generating circuit, controlled by a first switching signal to connect the input terminal of the analog circuit to the output terminal of the digital circuit or the output terminal of the signal generating circuit.

10. The digital signal output device according to claim 5, further comprising:
    a latch circuit, latching an output signal of the analog circuit; and
    a second switching circuit, coupled to an output terminal of the analog circuit, the synchronization circuit, and the latch circuit, controlled by a second switching signal to connect the output terminal of the analog circuit to an input terminal of the synchronization circuit or an input terminal of the latch circuit.

* * * * *